(12) United States Patent
Lin et al.

(10) Patent No.: US 6,305,596 B1
(45) Date of Patent: Oct. 23, 2001

(54) APPARATUS AND METHOD FOR SOLDERING THROUGH-HOLE COMPONENTS ON CIRCUIT BOARD

(75) Inventors: Shui-Town Lin; Shih-Ren Chuang, both of Taipei (TW)

(73) Assignee: Asustek Computer Inc. (TW)

(*) Notice: Subject to any disclaimer, the term of this patent is extended or adjusted under 35 U.S.C. 154(b) by 0 days.

(21) Appl. No.: 09/220,279

(22) Filed: Dec. 23, 1998

(30) Foreign Application Priority Data

Jun. 18, 1998 (TW) .................................................. 87109739

(51) Int. Cl.⁷ .................................................. B23K 31/00
(52) U.S. Cl. .............................. 228/125; 228/36; 228/43; 228/219; 228/180.1; 228/20.1
(58) Field of Search ................................. 228/125, 36, 43, 228/219, 180.1, 20.1

(56) References Cited

U.S. PATENT DOCUMENTS

| | | | |
|---|---|---|---|
| 3,834,015 | * 9/1974 | DiRenzo | 29/628 |
| 5,156,324 | * 10/1992 | Hueste et al. | 228/180.1 |
| 5,520,320 | * 5/1996 | McKean et al. | 228/102 |
| 5,678,752 | * 10/1997 | Kaminsky et al. | 228/223 |

* cited by examiner

Primary Examiner—M. Alexandra Elve
(74) Attorney, Agent, or Firm—Coudert Brothers

(57) ABSTRACT

A method for breaking off solder bridges between pins of a through-hole component on a printed circuit board, comprises the following steps: (1) providing a soldering apparatus, the apparatus having an opening corresponding to the through-hole component, the opening defining an opening wall surface, providing a slit at a predetermined position of the opening wall surface; and (2) blowing a gas of a predetermined temperature and a predetermined pressure at a predetermined time to the position of the solder bridges through the slit for removing the solder bridges from the through-hole component.

10 Claims, 9 Drawing Sheets

APPARATUS AND METHOD FOR SOLDERING THROUGH-HOLE COMPONENTS ON CIRCUIT BOARD

FIELD OF INVENTION

The present invention relates to an apparatus for soldering through-hole components on a printed circuit board (PCB).

BACKGROUND OF INVENTION

Conventional manufacturing processes for soldering through-hole components with fine pitch on a printed circuit board can be classified into the following five types. The first one is the print process of solder paste via reflow soldering. The second is the wave soldering process via carrier. The third is the iron soldering process. The fourth is the automatic point-soldering process. The last is the numerical control (NC) multi-point soldering process. The disadvantages of these prior art processes are as follows.

The first type of process does not provide solder sufficiently to each pin of the through-hole component during the soldering process. By the first type of process, therefore, the through-hole component cannot withstand a large impact force from outside. In the second type of process, the printed circuit board is disposed at an additional height when being placed on the carrier. The additional height leads to the hard-to-solve problems of solder bridges and "opens" during the process. The "opens" are conditions in which the pins of the through-hole component get no molten solder when being soldered. Besides, the second type of process needs a large number of carriers for mass production, and thus is expensive. The third type of process consumes much time and also brings a great quantity of residual flux to the through-hole component. In a circuit test for the printed circuit board through the third type process, the residual flux will lead to an incorrect test result. In the fourth type of process, a control program is necessary for the automatic process. In addition, the soldering speed of the fourth type of process is very slow. The fifth type of process brings a large number of solder bridges to the through-hole component.

Figure 1A:
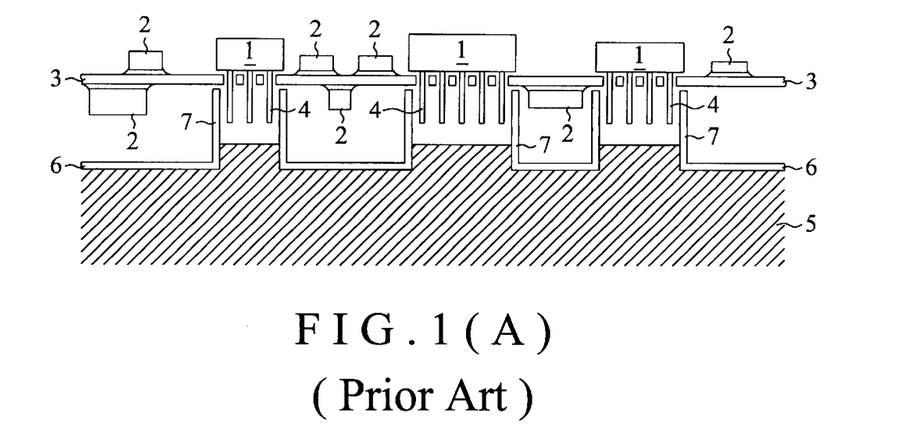
FIGS. 1(A), (B) and (C) shows respectively the procedures of the multi-point soldering process.
Figure 1B:
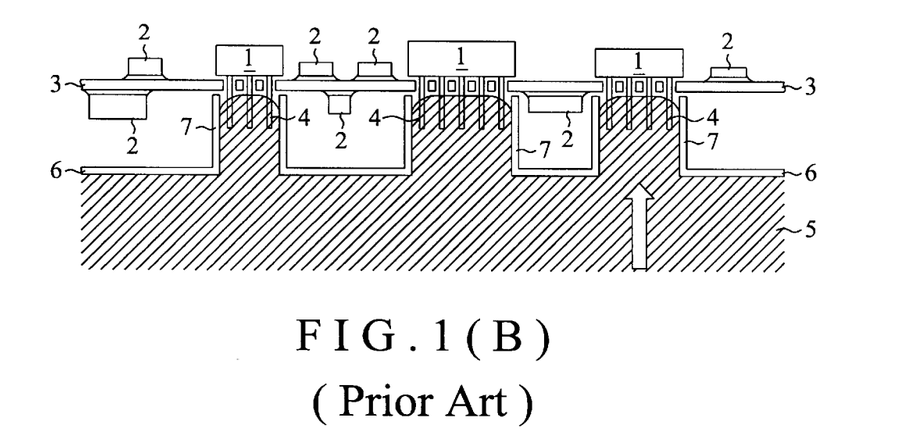
Figure 1C:
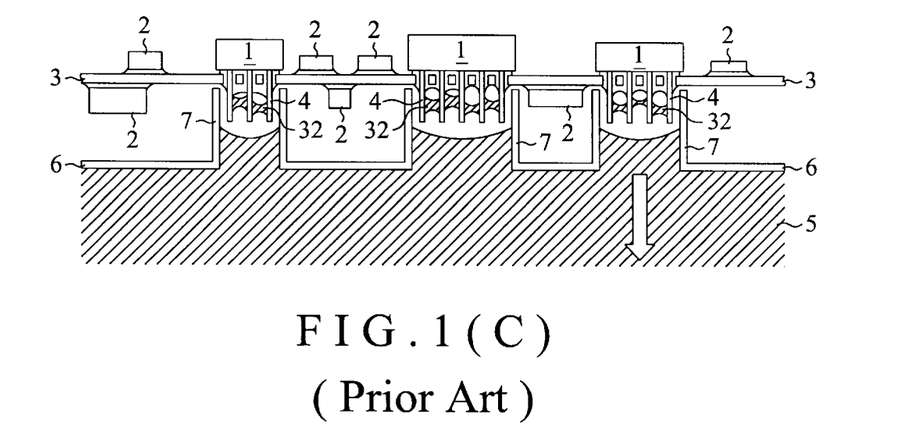

FIGS. 1(A), 1(B) and 1(C) show the process and configuration of a prior art multi-point soldering machine. A printed circuit board 3 is manufactured with a double-side board process. After surface mount devices (SMD) 2 are mounted, through-hole components 1 are placed over corresponding holes on the printed circuit board 3 either manually or by a machine. Pins 4 of the through-hole components 1 are sprayed with flux. After being preheated, the printed circuit board 3 is placed on the multi-point soldering machine for the soldering.

The multi-point soldering machine includes a solder bath tank in which the level of the solder wave 5 is controlled by a motor. The multi-point soldering machine also includes a fixture 6 having a plurality of openings 7. Each opening 7 corresponds to one of the through-hole components 1. The location of each opening 7 depends on the location of the corresponding through-hole component 1. Before the soldering, the printed circuit board 3 is first placed on the fixture 6, as shown in FIG. 1(A). At the beginning of soldering, a solder wave 5 is controlled to rise up into each opening 7, and the solder wave 5 wets the pins 4 of the corresponding through-hole component 1, as shown in FIG. 1(B). After the molten solder stays on the pins 4 for a certain period, the solder wave 5 falls, as shown in FIG. 1(C).

For fine-pitched through-hole component 1, this multi-point soldering process cannot avoid solder bridges 32.

There are two reasons for which solder bridges are produced during this process. First, the solder wave 5 cannot pull down the solder bridges 32 between the adjacent pins 4 due to the high surface tension of the solder, when descending. Next, the solder bridge 32 is easily formed between adjacent ones of the pins 4 due to the formation of a large quantity of oxide over the solder, which inherently increases the surface tension of the solder.

In view of these disadvantages of the traditional technique, the main objective of the invention is to provide a soldering method to improve the yield, to shorten the cycle time, to enhance the reliability of soldered joints, and to reduce the cost. Another object of the invention is to overcome the problem of a great quantity of solder residuals such as solder bridges formed in the multi-point soldering process. A hot gas, mentioned in this invention, represents comprehensively a hot air or a hot inert gas.

SUMMARY OF INVENTION

This invention provides a method and apparatus for breaking off solder bridges between pins of a through-hole component on a printed circuit board.

According to this invention, a multi-point soldering apparatus for soldering a through-hole component on a printed circuit board is provided. The apparatus comprises a solder bath tank for storing molten solder, a fixture having an opening corresponding to the through-hole component. The opening defines an opening wall surface on which a slit is provided at a predetermined position. At a predetermined time, a gas of a predetermined temperature and a predetermined pressure blows to the solder bridges through the slit for removing the solder bridges from the through-hole component.

DETAILED DESCRIPTION OF THE INVENTION

Figure 2:
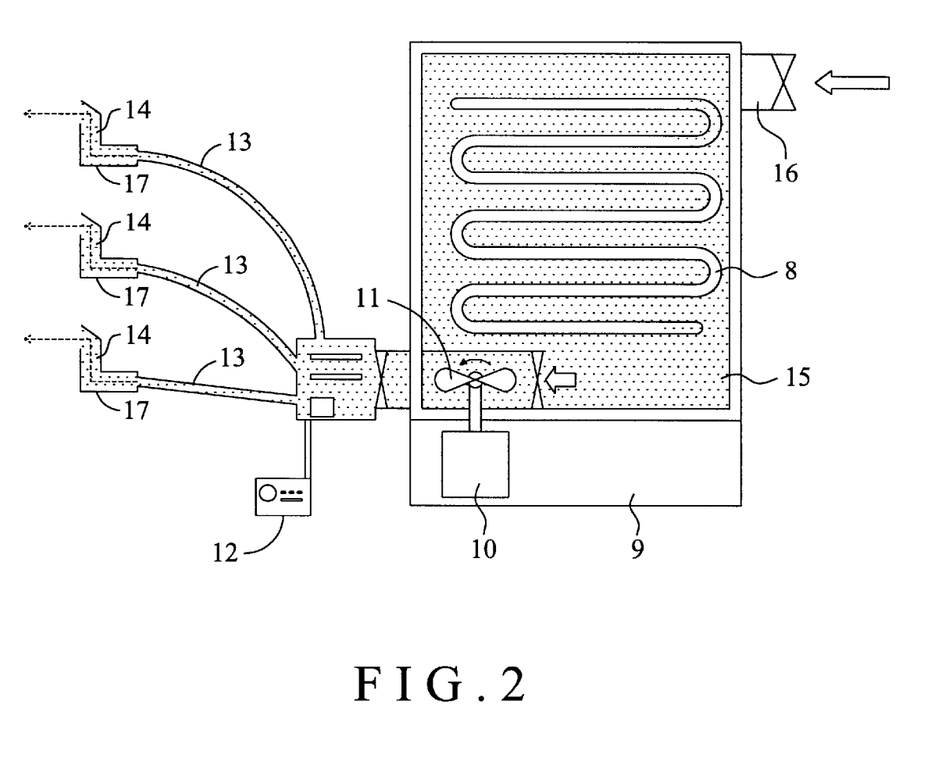
FIG. 2 shows a high temperature heat chamber.

According to the invention, as shown in FIG. 2, other than a hot-gas multi-point soldering machine, a high temperature heat chamber 9 external to the multi-point soldering machine is provided. The high temperature heat chamber 9 includes a high speed motor 10, a fan 11, a adapter controller 12, a plurality of flexible copper tubes 13, and a plurality of precise gas-duct adapters 17.

Air is sucked into the heat chamber 9 from an inlet 16. The sucked air is heated to a predetermined temperature via an electric-heating tube 8, and then is drawn out by the high speed motor 10. The heated air is fed into each flexible copper tube 13 through the adapter controller 12, and then is fed into each precise gas-duct adapter 17. At the moment when the solder wave 5 falls and separates from the pins 4, the hot air 14 simultaneously blows into each opening 7 of the fixture 6 to break off the solder bridges 32 between the pins 4.

Figure 3A:
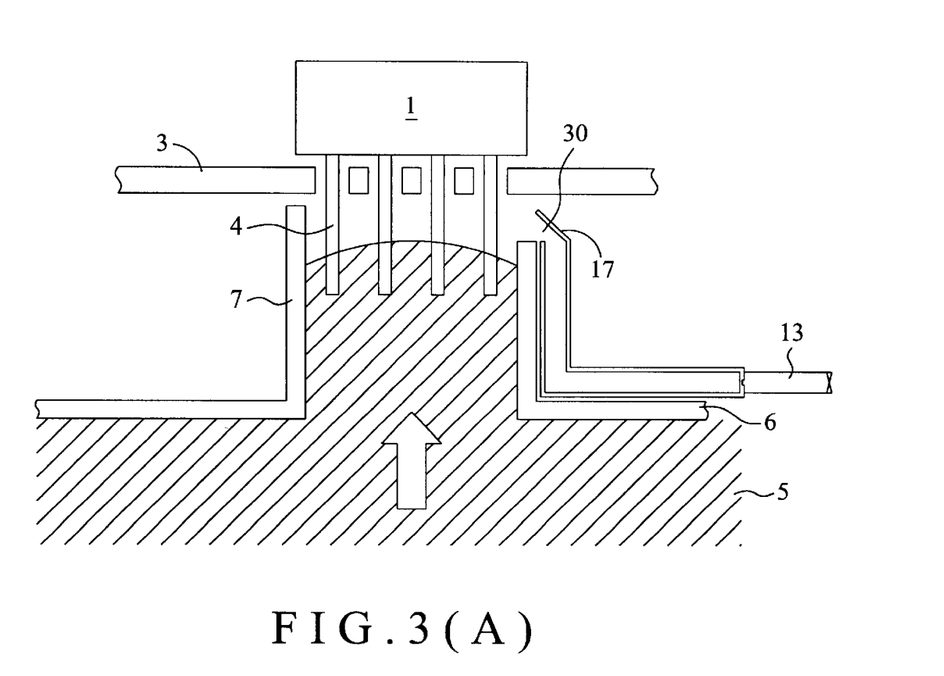
FIG. 3(A) reveals the soldering procedure of the invention.
Figure 3B:
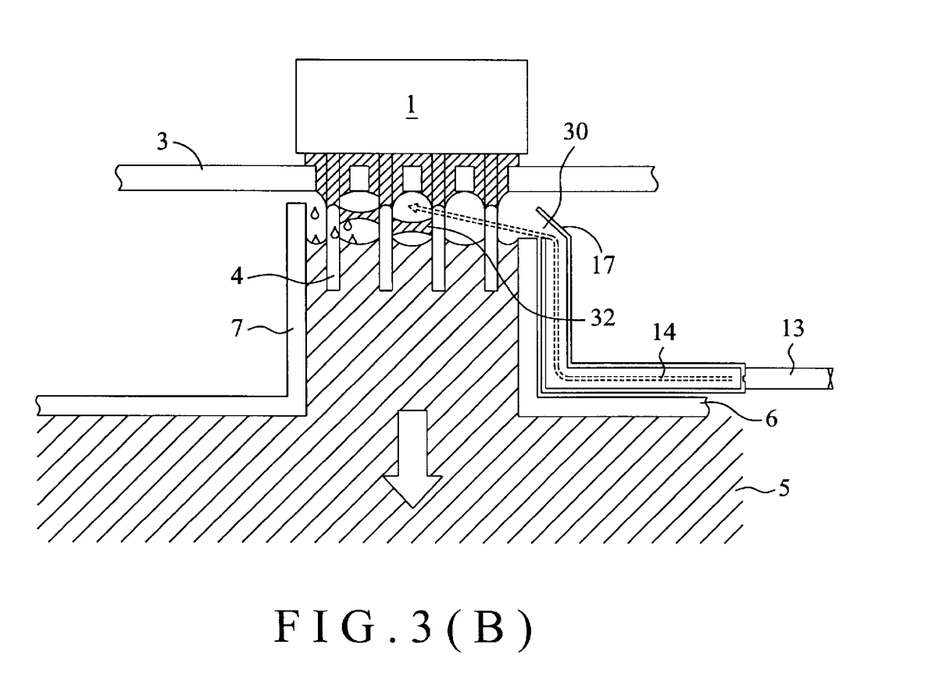
FIG. 3(B) shows the procedure of removing the solder bridges according to the invention.
Figure 3C:
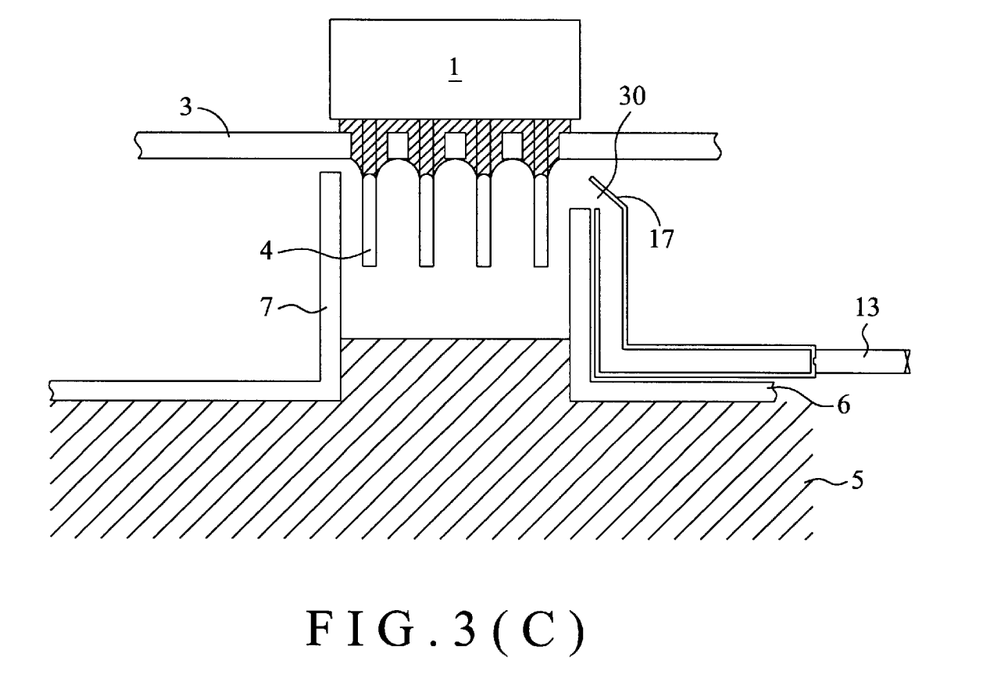
FIG. 3(C) shows a status when the removing procedure of the invention is complete.
Figure 4:
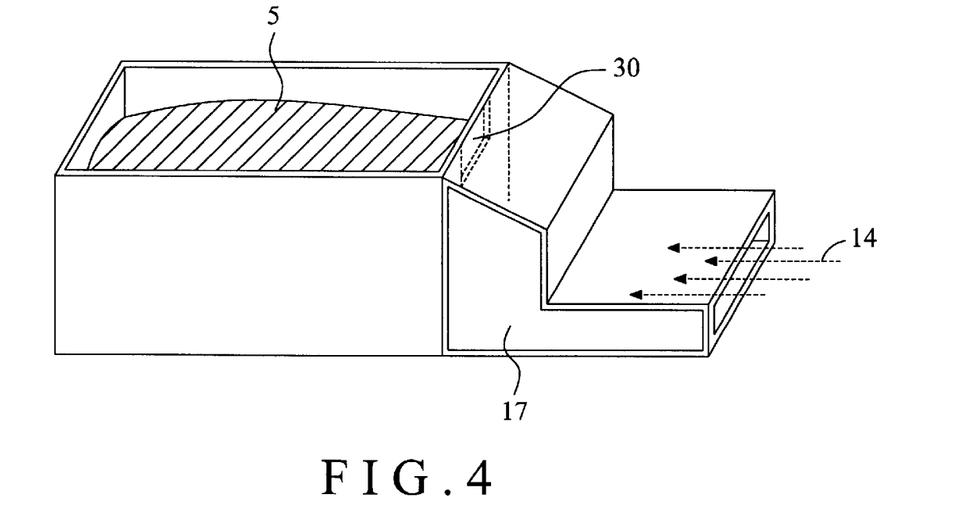
FIG. 4 is a diagram showing the details of a precise gas-duct adapter 17.

The operation of the hot-gas multi-point soldering machine of the invention is similar to those of the conventional multi-point soldering machine. As shown in FIGS. 3(A), (B), and (C), first a printed circuit board 3 is placed on a fixture 6. Then the solder wave 5 rises into the openings 7 to wet the pins 4, as shown in FIG. 3(A). The molten solder stays at the pins 4 for a while, and then the solder wave 5 falls and, at this moment, the hot air 14 blows into each opening 7 to break off the solder bridges 32 between the pins 4, as shown in FIG. 3(B). The soldering process is ended when the solder wave 5 falls down to the initial level and the solder bridges 32 are broken off, as shown in FIG. 3(C). As shown in FIG. 4, the detailed relationship between the slit 30 on the wall of one opening 7 of the fixture 6 and the corresponding gas-duct adapter 17 is illustrated.

Due to length difference of the pins 4 across different components 1, or due to the warpage effect resulting from heat, the solidification times of the molten solders at different components 1 are different when performing the soldering process. To ensure the breaking-off of the solder bridges 32 or partly solidified solder, the temperature of the hot air 14 blowing to the pins 4 must be more than 183° C. (the melting point of a Sn63/Pb37 alloy).

Figure 5:
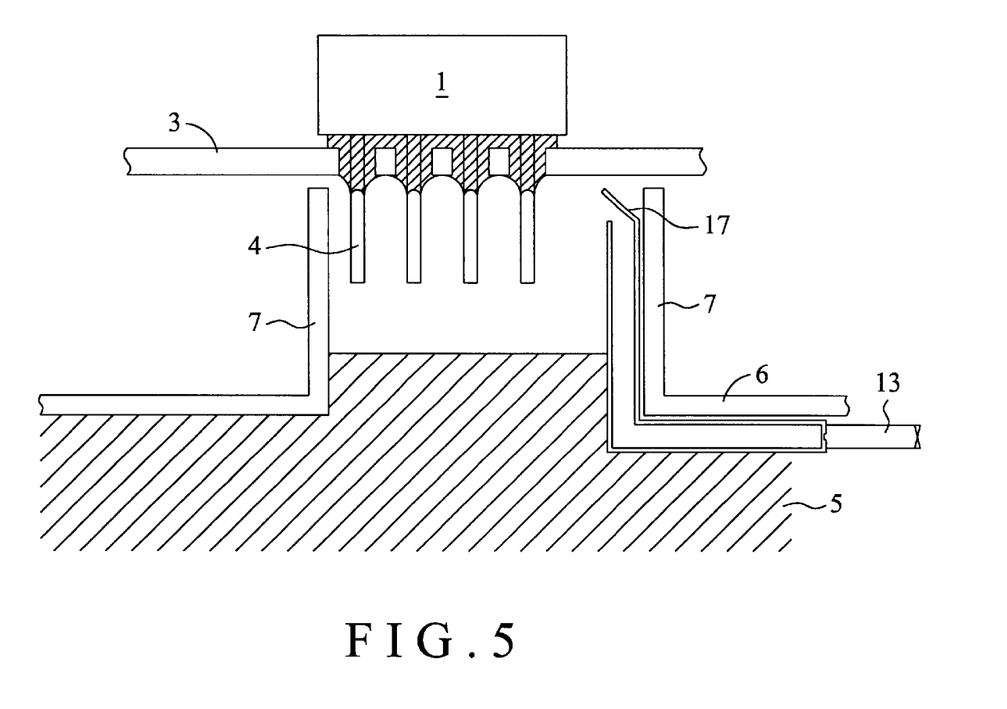
FIG. 5 shows the arrangement of a flexible copper tube 13 and a precise gas-duct adapter 17 in another embodiment.

As the temperature of the high temperature heat chamber 9 is not high enough to heat the hot air 14 above 183° C., an alternative method, as shown in FIG. 5, is to set the flexible copper tubes 13 and the precise gas-duct adapters 17 within the solder bath tank. The longer are the flexible copper tubes 13 within the solder bath tank, the higher is the temperature of the hot air 14.

The size of one opening 7 of the fixture 6 is determined according to the density of components on the printed circuit board 3 and the size of the corresponding through-hole component 1. This leads to, more or less, difference of rising speed and falling speed of the solder wave 5 among different openings 7 during soldering process. Especially, the difference of falling speed of the solder wave 5 among different openings 7 affects significantly the best moment when the hot air 14 starts blowing. While the solder wave 5 does not fall to a minimum level and the blowing of the hot air 14 is activated, this will lead to the sputtering of the molten solder to form more solder bridges 32. To avoid the undesired condition, the best moment, when the hot air 14 within each flexible copper tube 13 starts blowing into the opening 7, is controlled by the adapter controller 12. As to a larger opening 7 of the fixture 6, due to insufficient pressure of the blowing hot air 14, the solder bridges 32 may not be broken off as desired. The adapter controller 12 is used to pump the pressure of the blowing hot air 14 to overcome this problem.

Due to cost concern for some through-hole component of smaller size, the precise gas-duct adapter 17 is designed to be a detachable type. The gas-duct adapter 17 may be attached to the wall corresponding to the opening 7 by high temperature tolerant adhesive. As the position of the through-hole component 1 of the printed circuit board 3 changes, the recycled precise gas-duct adapter 17 is attached to the corresponding wall of the opening 7 of a new fixture 6. This reduces the manufacture cost of the precise gas-duct adapter 17.

Figure 6:
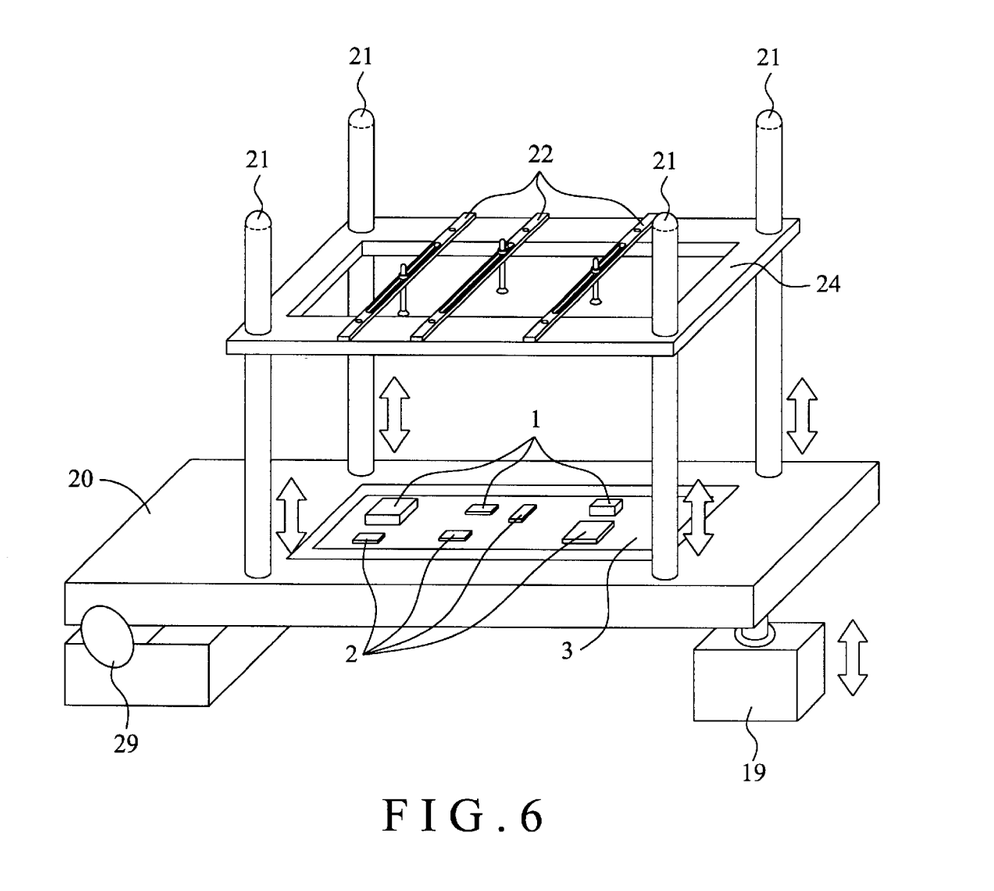
FIG. 6 reveals an inclinable carrier.

As shown in FIG. 3, the pins 4 on the front row is nearer to the inlet of the blowing hot air 14, and the pins 4 on the back row is farther from the inlet of the blowing hot air 14. The pins 4 on the front row impose a shadow effect to the pins 4 on the back row. The shadow effect means that the blowing hot air 14 can not reach the pins 4 on the back row due to the front row, or that the hot air 14, accompanied with the dropped molten solder from the pins 4 on the front row, reaches the pins 4 on the back row. The shadow effect makes the breaking-off of the solder bridges 32 of the pins 4 on the back row more difficult. In the present invention, an inclinable carrier is attached to the fixture 6 of the hot-gas multi-point soldering machine, as shown in FIG. 6, to resolve the shadow effect. The inclinable carrier is used to lift up one side of the printed circuit board 3 when the solder wave 5 falls. The lifting-up of one side of the printed circuit board 3 forces the molten solder at the pins 4 of the front row to flow gently to the back row, and enables most of the blowing hot air 14 to reach the pins 4 on the back row. This leads to successful breaking-off of the solder bridges 32.

The inclinable carrier includes a lower carrier 20 placing the printed circuit board 3, an upper carrier 24 preventing the through-hole components 1 from being lifted, a motor 19 driving one side movement of the upper carrier 24 and the lower carrier 20, a bearing 29 supporting another side of the lower carrier 20, and four screws 21 enabling the movement between the upper carrier 24 and the lower carrier 20.

Figure 7A:
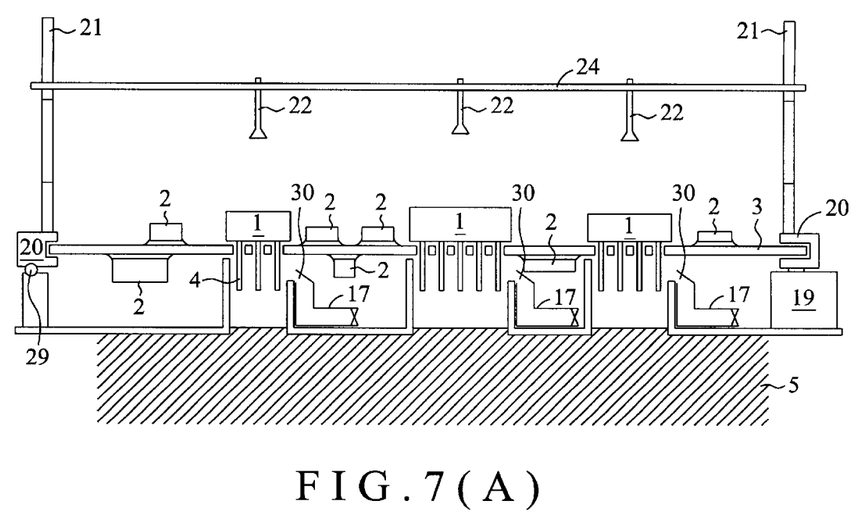
FIG. 7(A) shows the first status of the inclinable carrier during operation.
Figure 7B:
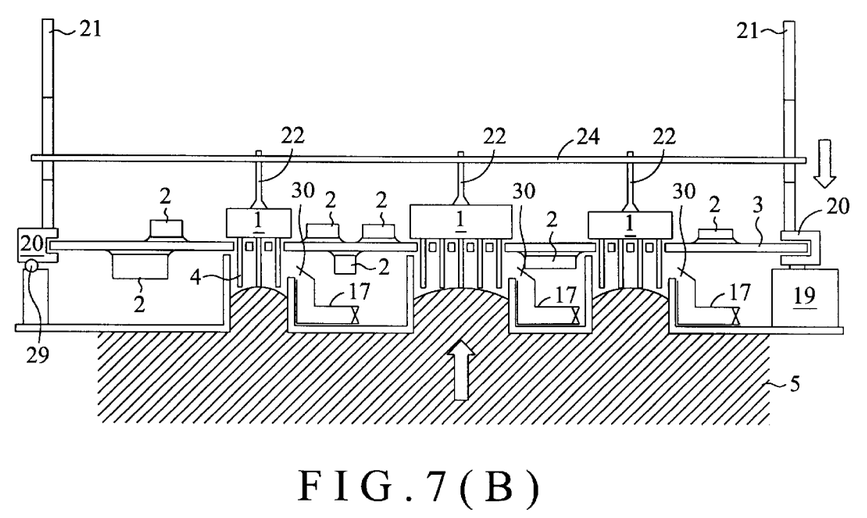
FIG. 7(B) shows the second status of the inclinable carrier during operation.
Figure 7C:
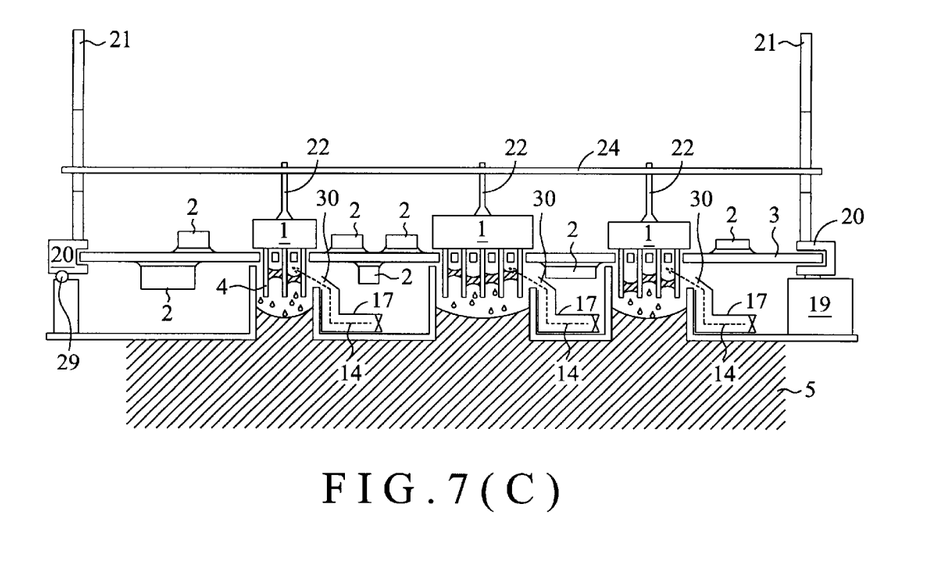
FIG. 7(C) shows the third status of the inclinable carrier during operation.
Figure 7D:
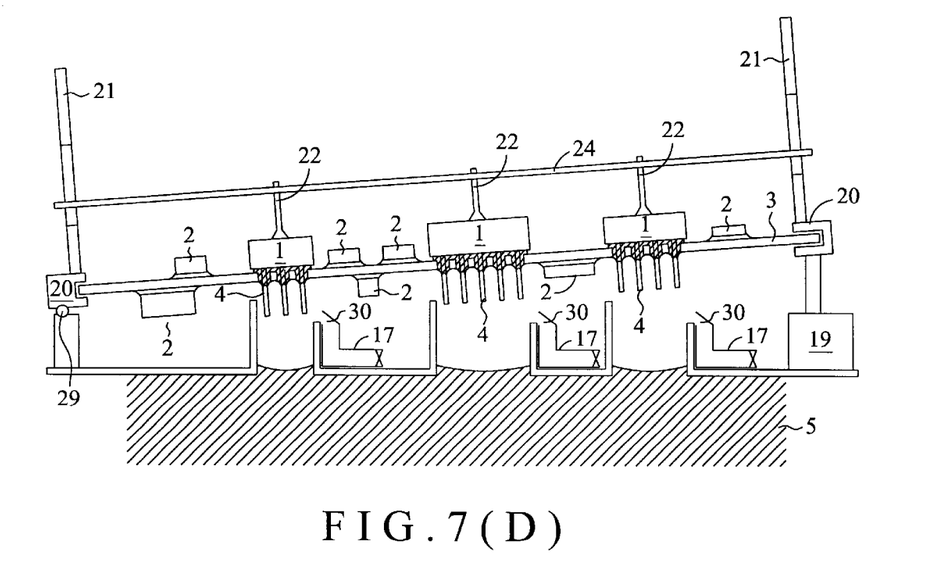
FIG. 7(D) shows the fourth status of the inclinable carrier during operation.

As shown in FIGS. 7(A), (B), (C), and (D), the operations of the hot-gas multi-point soldering machine, with the inclinable carrier, are described as follows:

1. placing the printed circuit board 3, on which through-hole components 1 are inserted, on the lower carrier 20, as shown in FIG. 7(A);
2. lowering the four screws to drive the upper carrier 24 pressing the through-hole components 1 by the components 22;
3. the solder wave 5 rises into the openings 7 of the fixture 6, as shown in FIG. 7(B);
4. the solder wave 5 wets the pins 4;
5. the solder wave 5 falls, slowly lifts up one side of the upper carrier 24 and the lower carrier 20, and blowing the hot air 14 to break off the solder bridges 32 at the same time, as shown in FIG. 7(C);
6. after one side of the upper carrier 24 and lower carrier 20 is lifted up to a predetermined level, stop blowing the hot air 14, as shown in FIG. 7(D);
7. the motor 19 lowers the upper carrier 24 and the lower carrier 20 to a horizontal position;
8. lifting up the four screws to move up the upper carrier 24;
9. taking out the printed circuit board 3.

If the surface tension of the solder is too high, or if the pressure of the hot air is not enough, a hot inert gas 14 (at temperature more than 183° C.), such as a hot nitrogen, may replace the hot air 14. The hot inert gas is utilized to reduce the surface tension of the molten solder, and to make the molten solder on the pins 4 flow back into the solder bath easily. This reduces the quantity of the solder bridges 32.

What is claimed is:

1. An apparatus for soldering a through-hole component with pins protruding therefrom inside a through-hole through a printed circuit board, said apparatus comprising:

a solder tank containing molten solder therein;

a fixture disposed over said solder tank, said fixture having a tubular opening with an inner wall, said printed circuit board being placed on said fixture such that said through-hole is over said opening; and means for causing a gas of a predetermined temperature and a predetermined pressure to be blown into said opening and thereby removing portions of said solder remaining between pairs of said pins.

2. The apparatus of claim 1, further comprising an inclinable carrier for lifting up one side of said printed circuit board so as to prevent a shadow effect caused by proximal ones of said pins inserted into said through-hole from blocking said gas blowing onto distal ones thereof.

3. The apparatus of claim 2, wherein said inclinable carrier further comprises:

a lower carrier for holding the printed circuit board;

a driver for inclining one side of said lower carrier; and an upper carrier having a component for pressing said through-hole component on said printed circuit board.

4. The apparatus of claim 1, wherein said gas causing means further comprises:

a heat chamber for generating said gas;

a adapter having a slit provided at a predetermined position of said inner wall, for blowing said gas onto said pins inserted into said through-hole through said slit;

a controller for controlling said gas having said predetermined temperature and said predetermined pressure; and a connecting tube for connecting between said heat chamber and said adapter through said controller.

5. The apparatus of claim 4, wherein said connecting tube is immersed into said molten solder.

6. The apparatus of claim 4, wherein said predetermined temperature is above a melting temperature of said solder.

7. The apparatus of claim 1, wherein said gas causing means further comprises:

a heat chamber for generating said gas;

a blowing tube provided at a predetermined position of said inner wall, for blowing said gas onto said pins inserted into said through-hole;

a controller for controlling said gas having said predetermined temperature and said predetermined pressure; and a connecting tube for connecting between said heat chamber and said blowing tube through said controller.

8. The apparatus of claim 7, wherein said connecting tube is immersed in said molten solder.

9. The apparatus of claim 7, wherein said predetermined temperature is above a melting temperature of said solder.

10. The apparatus of claim 1, wherein said predetermined temperature is above a melting temperature of said solder.

* * * * *